(12) United States Patent
Diaz et al.

(10) Patent No.: US 9,871,141 B2
(45) Date of Patent: Jan. 16, 2018

(54) THERMALLY TUNING STRAIN IN SEMICONDUCTOR DEVICES

(71) Applicant: Taiwan Semiconductor Manufacturing Company, Ltd., Hsin-Chu (TW)

(72) Inventors: Carlos H. Diaz, Mountain View, CA (US); Chih-Hao Wang, Baoshan Township (TW); Gwan Sin Chang, Hsin-Chu (TW); Jean-Pierre Colinge, Hsin-Chu (TW); Kuo-Cheng Ching, Zhubei (TW); Zhiqiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/090,099

(22) Filed: Apr. 4, 2016

(65) Prior Publication Data
US 2016/0218216 A1    Jul. 28, 2016

Related U.S. Application Data

(62) Division of application No. 13/944,632, filed on Jul. 17, 2013, now Pat. No. 9,349,850.

(51) Int. Cl.
*H01L 29/78* (2006.01)
*H01L 29/06* (2006.01)
(Continued)

(52) U.S. Cl.
CPC .... *H01L 29/7849* (2013.01); *H01L 21/02104* (2013.01); *H01L 21/76224* (2013.01);
(Continued)

(58) Field of Classification Search
USPC .......................................... 257/347
See application file for complete search history.

(56) References Cited

U.S. PATENT DOCUMENTS 6,359,311 B1    3/2002  Colinge et al.
7,109,516 B2    9/2006  Langdo et al.
(Continued)

FOREIGN PATENT DOCUMENTS

CN    102931090 A    2/2013
DE    112006000241    1/2010
(Continued)

OTHER PUBLICATIONS

Bangsaruntip, G.M. et al., "High Performance and Highly Uniform Gate-All-Around Silicon Nanowire MOSFETs with Wire Size Dependent Scaling," 4 pages, Dec. 7-9, 2009.
(Continued)

*Primary Examiner* — Lawrence Tynes, Jr.
(74) *Attorney, Agent, or Firm* — Slater Matsil, LLP

(57) ABSTRACT

A method includes performing a first epitaxy to grow a silicon germanium layer over a semiconductor substrate, performing a second epitaxy to grow a silicon layer over the silicon germanium layer, and performing a first oxidation to oxidize the silicon germanium layer, wherein first silicon germanium oxide regions are generated. A strain releasing operation is performed to release a strain caused by the first silicon germanium oxide regions. A gate dielectric is formed on a top surface and a sidewall of the silicon layer. A gate electrode is formed over the gate dielectric.

20 Claims, 11 Drawing Sheets

(51) Int. Cl.
  *H01L 21/02* (2006.01)
  *H01L 21/762* (2006.01)
  *H01L 29/66* (2006.01)
(52) U.S. Cl.
  CPC .... *H01L 29/0649* (2013.01); *H01L 29/66545* (2013.01); *H01L 29/66795* (2013.01); *H01L 29/78* (2013.01); *H01L 29/785* (2013.01); *H01L 29/7848* (2013.01)

(56) References Cited

U.S. PATENT DOCUMENTS

| | | | |
|---|---|---|---|
| 7,241,653 | B2 | 7/2007 | Hareland et al. |
| 7,259,425 | B2 | 8/2007 | An et al. |
| 7,456,476 | B2 | 11/2008 | Hareland et al. |
| 7,508,031 | B2 | 3/2009 | Liu et al. |
| 7,820,513 | B2 | 10/2010 | Hareland et al. |
| 7,898,041 | B2 | 3/2011 | Radosavljevic et al. |
| 8,067,818 | B2 | 11/2011 | Shah et al. |
| 8,242,568 | B2 | 8/2012 | Ikeda et al. |
| 8,273,626 | B2 | 9/2012 | Hareland et al. |
| 8,405,164 | B2 | 3/2013 | Hareland et al. |
| 8,466,490 | B2 | 6/2013 | Liu et al. |
| 8,815,712 | B2 | 8/2014 | Wan et al. |
| 8,823,059 | B2 | 9/2014 | Dewey et al. |
| 8,969,179 | B2 | 3/2015 | Gotsmann et al. |
| 2004/0005740 | A1* | 1/2004 | Lochtefeld ........ H01L 21/28518 438/149 |
| 2004/0108523 | A1 | 6/2004 | Chen et al. |
| 2004/0108559 | A1 | 6/2004 | Sugii et al. |
| 2004/0166642 | A1 | 8/2004 | Chen et al. |
| 2005/0121706 | A1 | 6/2005 | Chen et al. |
| 2005/0127466 | A1 | 6/2005 | Furukawa et al. |
| 2006/0141740 | A1* | 6/2006 | Jeong ................ H01L 21/76232 438/424 |
| 2006/0172497 | A1 | 8/2006 | Hareland et al. |
| 2006/0189043 | A1 | 8/2006 | Schulz |
| 2006/0240622 | A1 | 10/2006 | Lee et al. |
| 2007/0120156 | A1 | 5/2007 | Liu et al. |
| 2007/0221956 | A1 | 9/2007 | Inaba |
| 2007/0241414 | A1 | 10/2007 | Narihiro |
| 2008/0017934 | A1 | 1/2008 | Kim et al. |
| 2008/0258207 | A1 | 10/2008 | Radosavljevic et al. |
| 2009/0008705 | A1 | 1/2009 | Zhu et al. |
| 2009/0061572 | A1 | 3/2009 | Hareland et al. |
| 2009/0212341 | A1* | 8/2009 | Cheng .................. H01L 27/108 257/316 |
| 2010/0059807 | A1 | 3/2010 | Cho et al. |
| 2010/0193770 | A1 | 8/2010 | Bangsaruntip et al. |
| 2010/0252801 | A1 | 10/2010 | Sekaric et al. |
| 2010/0258870 | A1* | 10/2010 | Hsu .................. H01L 29/66795 257/347 |
| 2012/0080686 | A1* | 4/2012 | Mauder ............... H01L 21/0237 257/76 |
| 2013/0228751 | A1 | 9/2013 | Gotsmann et al. |
| 2013/0270512 | A1 | 10/2013 | Radosavljevic et al. |
| 2013/0270652 | A1 | 10/2013 | Liaw |
| 2013/0285141 | A1 | 10/2013 | Kuo et al. |
| 2014/0001441 | A1 | 1/2014 | Kim et al. |
| 2014/0054724 | A1 | 2/2014 | Ching et al. |
| 2014/0175561 | A1 | 6/2014 | Colinge et al. |
| 2014/0183643 | A1 | 7/2014 | Colinge et al. |
| 2014/0197456 | A1 | 7/2014 | Wang et al. |
| 2014/0203334 | A1 | 7/2014 | Colinge et al. |
| 2014/0273363 | A1 | 9/2014 | Chiu et al. |
| 2014/0332852 | A1 | 11/2014 | Dewey |
| 2014/0353731 | A1 | 12/2014 | Colinge et al. |
| 2015/0008489 | A1 | 1/2015 | Ching et al. |
| 2015/0214333 | A1 | 7/2015 | Colinge et al. |

FOREIGN PATENT DOCUMENTS

| | | |
|---|---|---|
| DE | 102013103057 | 10/2013 |
| EP | 0449620 B1 | 8/1996 |
| JP | 2007258485 | 10/2007 |
| JP | 2011151272 | 8/2011 |
| KR | 1020130076680 | 7/2013 |
| KR | 1020130120973 | 11/2013 |

OTHER PUBLICATIONS

Bernard, Emilie et al., "First Internal Spacers' Introduction in Record High ION/IOFF TiN/HfO2 Gate Multichannel MOSFET Satisfying Both High Performance and Low Standby Power Requirements," IEEE Electron Device Letters, vol. 30, No. 2, pp. 148-151, Feb. 2009.

Blacic, James D. et al., "Plasticity and Hydrolytic Weakening of Quartz Single Crystals," Journal of Geophysical Research, vol. 89, No. B6, pp. 4223-4239, Jun. 10, 1984.

Dana et al., "Raman and TEM studies of Ge nanocrystal formation in SiOx:Ge/SiOx multilayers", Phys. Status Solidi C 4, 288 (2007). http://dx.doi.org/10.1002/pssc.200673233.

Ferain, Isabelle et al., "Multigate transistors as the future of classical metal-oxide-semiconductor field-effect transistors," Nature, vol. 479, pp. 2-8, Nov. 17, 2011.

Han, Jin-Woo et al., "Gate-All-Around Silicon Nanowire MOSFETs on Bulk Substrate," FB4-B, pp. 648-649, Feb. 19-20, 2009.

Kuhn, Kelin J. "Considerations for Ultimate CMOS Scaling," IEEE Transactions on Electron Devices, vol. 59, No. 7, 1813-1828, Jul. 2012.

Monfray, S. et al., "50nm—Gate All Around (GAA)—Silicon On Nothing (SON)—Devices: A Simple Way to Co-integration of GAA Transistors within bulk MOSFET process," IEEE Symposium on VLSI Technology Digest of Technical Papers, 2 pages, Jun. 11-13, 2002.

Moon, Dong-Il et al., "Silicon Nanowire All-Around Gate MOSFETs Built on a Bulk Substrate by All Plasma-Etching Routes" IEEE Electron Device Letters, vol. 32, No. 4, Apr. 2011.

Ojovan, M.I. et al., "Topologically disordered systems at the glass transition, White Rose Research Online," White Rose university consortium, Universities of Leeds, Sheffield & York, http://eprints.whiterose.ac.uk/1958, Journal of Physics: Condensed Matter, 18 (50), pp. 11507-11520. Dec. 2006.

Yeo, Kyoung et al., "Gate-All-Around (GAA) Twin Silicon Nanowire MOSFET (TSNWFET) with 15 nm Length Gate and 4 nm Radius Nanowires," 4 pages, Dec. 11-13, 2006.

* cited by examiner

THERMALLY TUNING STRAIN IN SEMICONDUCTOR DEVICES

PRIORITY CLAIM AND CROSS-REFERENCE

This application is a divisional of U.S. patent application Ser. No. 13/944,632, entitled "Thermally Tuning Strain in Semiconductor Devices," filed on Jul. 17, 2013, which application is incorporated herein by reference.

BACKGROUND

The reduction in the sizes and the inherent features of semiconductor devices (e.g., a Metal-Oxide-Semiconductor (MOS) device) has enabled continued improvement in speed, performance, density, and cost per unit function of integrated circuits over the past few decades.

To enhance the performance of MOS device, stress may be introduced into the channel region of a MOS transistor to improve carrier mobility. Generally, it is desirable to induce a tensile stress in the channel region of an N-type Metal-Oxide-Semiconductor (NMOS) device in a source-to-drain direction, and to induce a compressive stress in the channel region of a P-type Metal-Oxide-Semiconductor (PMOS) device in a source-to-drain direction.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Fin Field-Effect Transistors (FinFETs) and methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

Figure 1B:
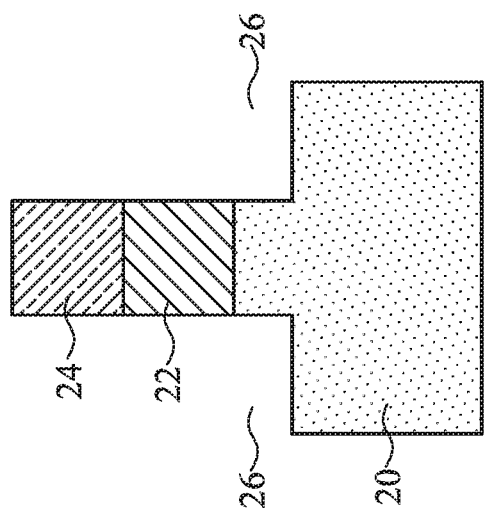
FIGS. 1A through 1J are cross-sectional views and perspective views of intermediate stages in the manufacturing of a Fin Field-Effect Transistor (FinFET) in accordance with some exemplary embodiments.
Figure 1A:
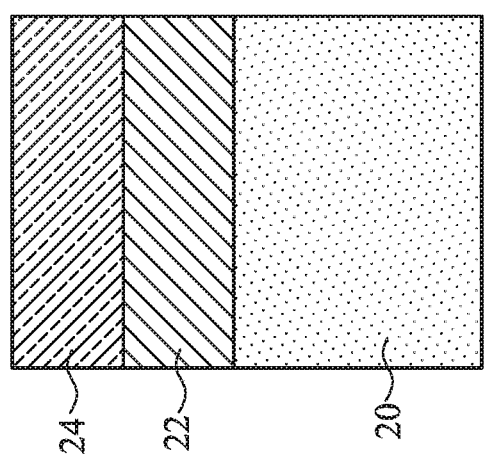

FIGS. 1A through 1I are cross-sectional views and perspective views of intermediate stages in the manufacturing of a FinFET in accordance with some exemplary embodiments. FIG. 1A illustrates a perspective view of substrate 20, which may be a part of a wafer. Substrate 20 may be a semiconductor substrate, which may further be a silicon substrate, a silicon-on-insulator substrate, or a substrate formed of other semiconductor materials. Substrate 20 may be doped with a p-type or an n-type impurity.

Silicon germanium (SiGe) layer 22 is formed over substrate 20 through epitaxy. Accordingly, SiGe layer 22 forms a crystalline layer. In some embodiments, the germanium percentage (atomic percentage) of SiGe layer 22 is between about 10 percent and about 80 percent. It is appreciated, however, that the values recited throughout the description are merely examples, and may be changed to different values.

Silicon layer 24 is formed over SiGe layer 22 through epitaxy. In some embodiments, silicon layer 24 is free from germanium, or is a substantially pure silicon layer that is substantially free from germanium, for example, with a germanium percentage lower than about 1 percent. Silicon layer 24 may be doped with a p-type or an n-impurity such as boron, phosphorous, or the like.

Referring to FIG. 1B, an etch step is performed to etch silicon layer 24, SiGe layer 22, and substrate 20, forming trenches 26. The etch may be performed using a dry etch step adopting an anisotropic etching method, so that the sidewalls of trenches 26 are substantially vertical.

Figures 1, 1C, 2:
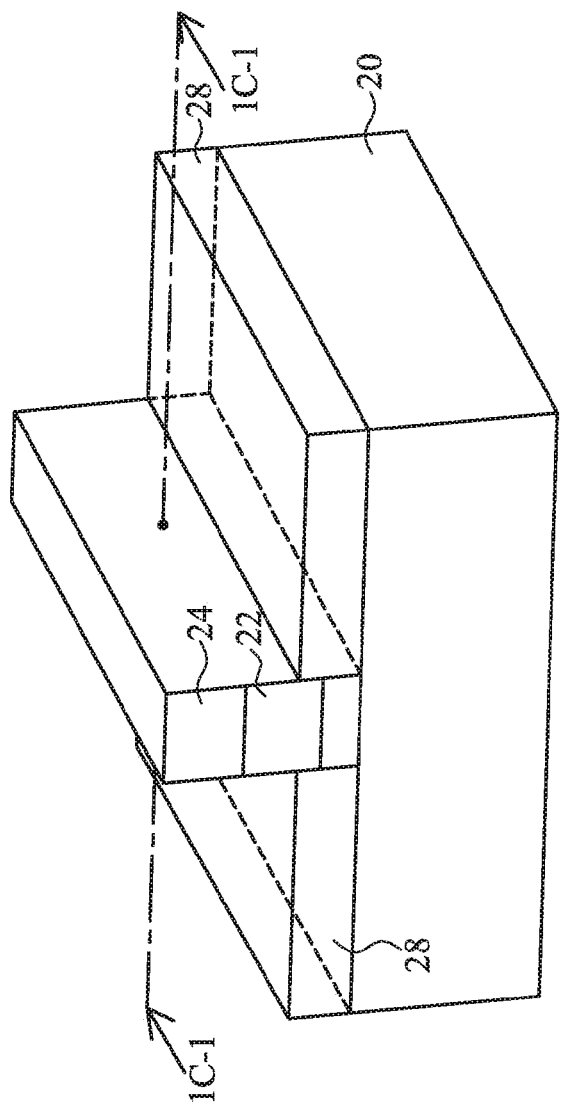
Figures 1, 1C:
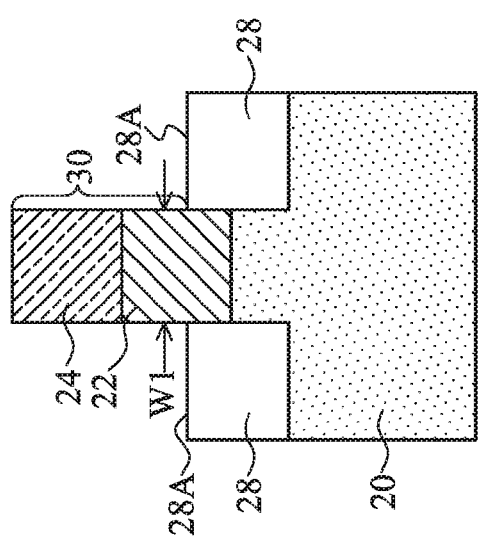

Next, as shown in FIG. 1C-1, isolation regions 28, which may be Shallow Trench Isolation (STI) regions, are formed in trenches 26 (FIG. 1B). The formation may include filling trenches 26 with a dielectric layer(s), and performing a Chemical Mechanical Polish (CMP) to level the top surface of the dielectric material with the top surface of silicon layer 24. STI regions 28 are then recessed. The top surface 28A of the resulting STI regions 28 may be lower than the top surface of SiGe layer 22. Top surface 28A may be higher than, level with, or lower than, the bottom surface of SiGe layer 22 in some embodiments. Throughout the description, the portions of silicon layer 24 and SiGe layer 22 over top surface 28A of STI regions 28 are referred to as fin 30 hereinafter.

FIG. 1C-2 illustrates a perspective view of the structure in FIG. 1C-1, wherein the cross-sectional view in FIG. 1C-1 is obtained from the vertical plane containing line 1C-1-1C-1 in FIG. 1C-2. Alternatively stated, if a line (not shown) is drawn running from source to drain, then the illustrated vertical plane in FIG. 1C-1 is perpendicular to the line.

Figures 1, 1D:
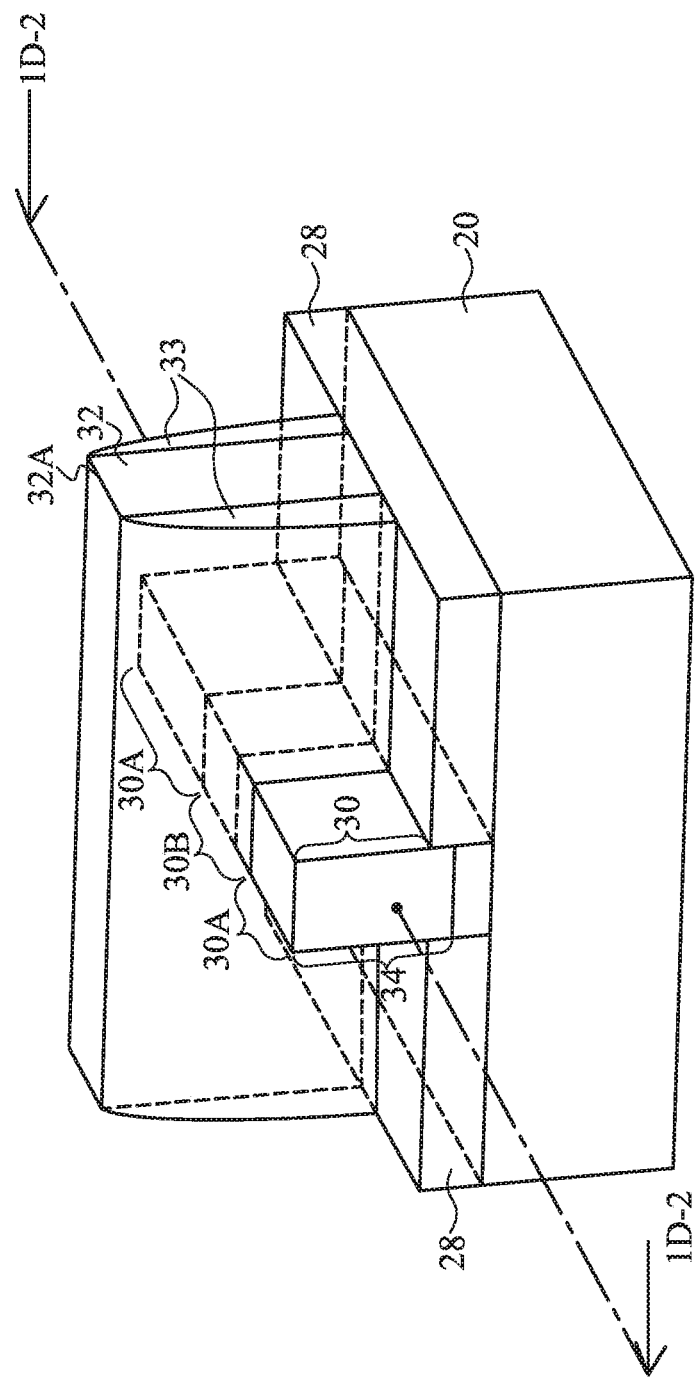
Figures 1, 1D, 2:
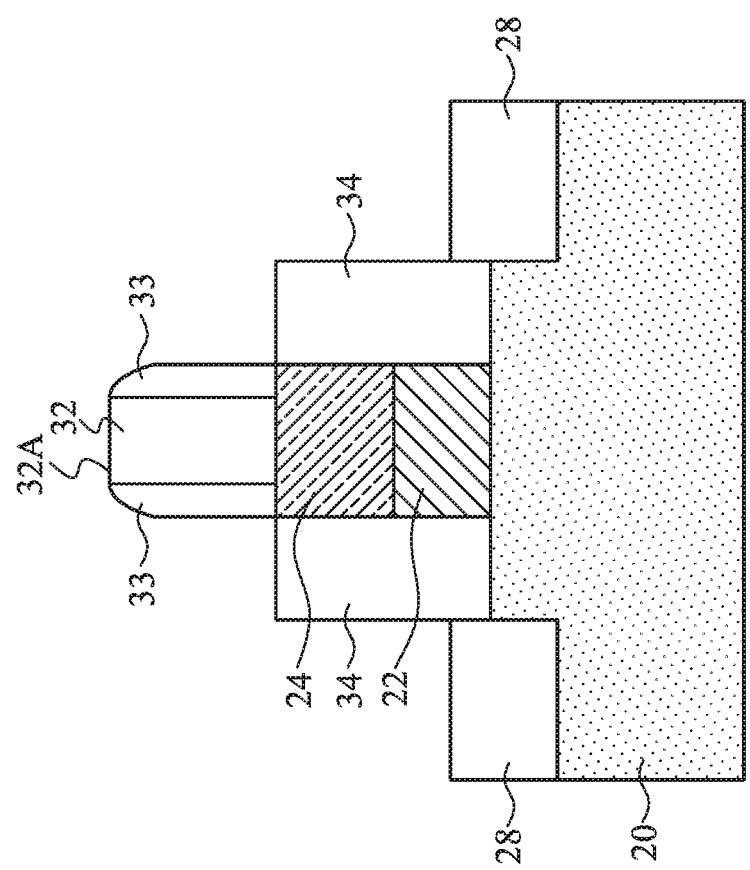

Referring to FIGS. 1D-1 and 1D-2, which are a perspective view and a cross-sectional view, respectively, dummy gate 32 and spacers 33 are formed. Dummy gate 32 may be formed of, for example, polysilicon, although other materials may also be used. In some embodiments, dummy gate 32 has a composite structure comprising a plurality of layers, and may include, for example, a silicon nitride layer and/or a silicon oxide layer as a bottom layer (not shown), and a top layer (not shown) over the bottom layer, wherein the top layer may be a polysilicon layer, for example. Dummy gate 32 has top surface 32A higher than the top surface of semiconductor fin 30. The formation of dummy gate 32 may include forming blanket dummy gate layer(s), performing a CMP to level the top surface of the blanket dummy gate layer(s), and patterning the blanket dummy gate layers. The remaining portion of the blank layers(s) is dummy gate 32. Dummy gate 32 covers middle portion 30B of semiconductor fin 30, and opposite end portions 30A of semiconductor fin 30 are not covered. Dummy gate 32 may also have a lengthwise direction substantially perpendicular to the lengthwise direction of semiconductor fin 30. Spacers 33 are formed on the sidewalls of dummy gate 32 in some embodiments.

FIG. 1D-2 illustrates a cross-sectional view of the structure in FIG. 1D-1, wherein the cross-sectional view is obtained from the vertical plane containing line 1D-2-1D-2 in FIG. 1D-1. In some embodiments, after the formation of dummy gate 32 and spacers 33, the exposed portions of fin 32 are etched to form recesses, followed by an epitaxy to grow a semiconductor material in the recess to form epitaxy regions 34. In some embodiments, epitaxy regions 34 comprise silicon, silicon phosphorous, or the like, and are doped heavily with n-type impurities such as phosphorous. An implantation may also be performed to dope the exposed portion (in fin portions 30A) of silicon layer 24 to form source and drain regions 34 (referred to as source/drain regions hereinafter), which may have an n-type impurity concentration between about $1E19/cm^3$ and about $1E21/cm^3$. Although FIG. 1D-1 shows that the sidewalls of source/drain 34 are straight, they may also be slanted. For example, source/drain 34 may also have a spade-shape in a cross-sectional view.

Figure 1E:
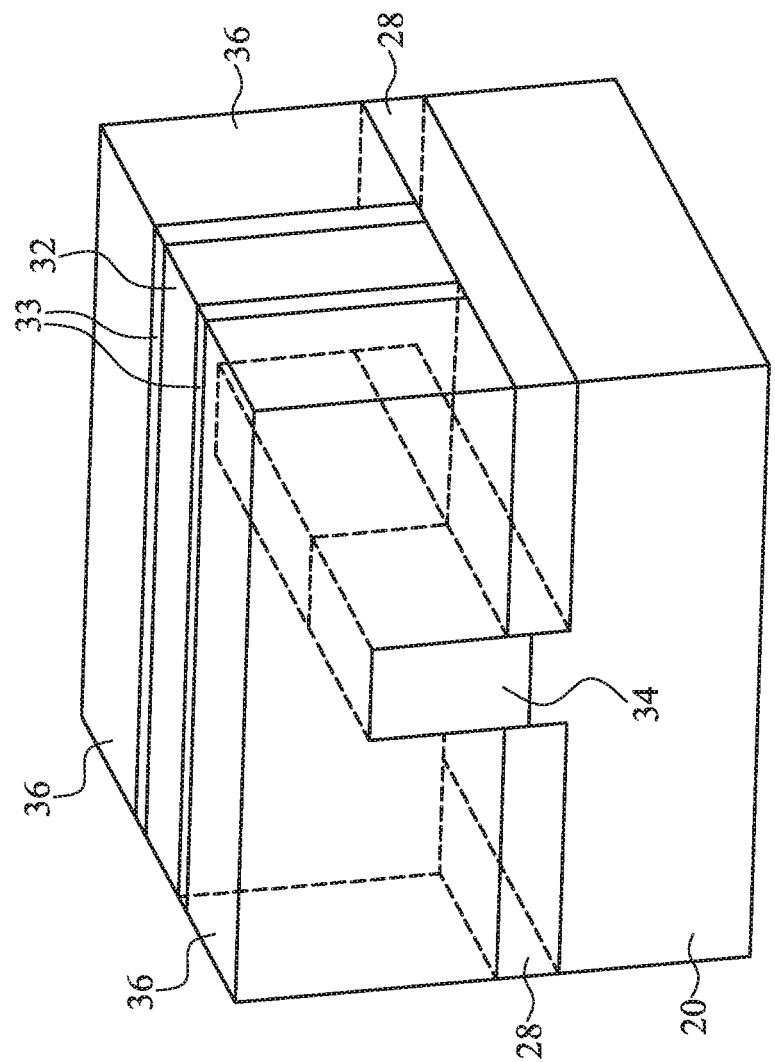

FIG. 1E illustrates a perspective view of the structure after the formation of Inter-Layer Dielectric (ILD) 36. ILD 36 is formed of a dielectric material such as Phospho-Silicate Glass (PSG), Boro-Silicate Glass (BSG), Boron-Doped Phospho-Silicate Glass (BPSG), spin-on-glass, or the like. A CMP may be performed to level the top surface of ILD 36 with the top surface of dummy gate 32. Accordingly, source/drain regions 34 are buried under ILD 36.

Figure 1F:
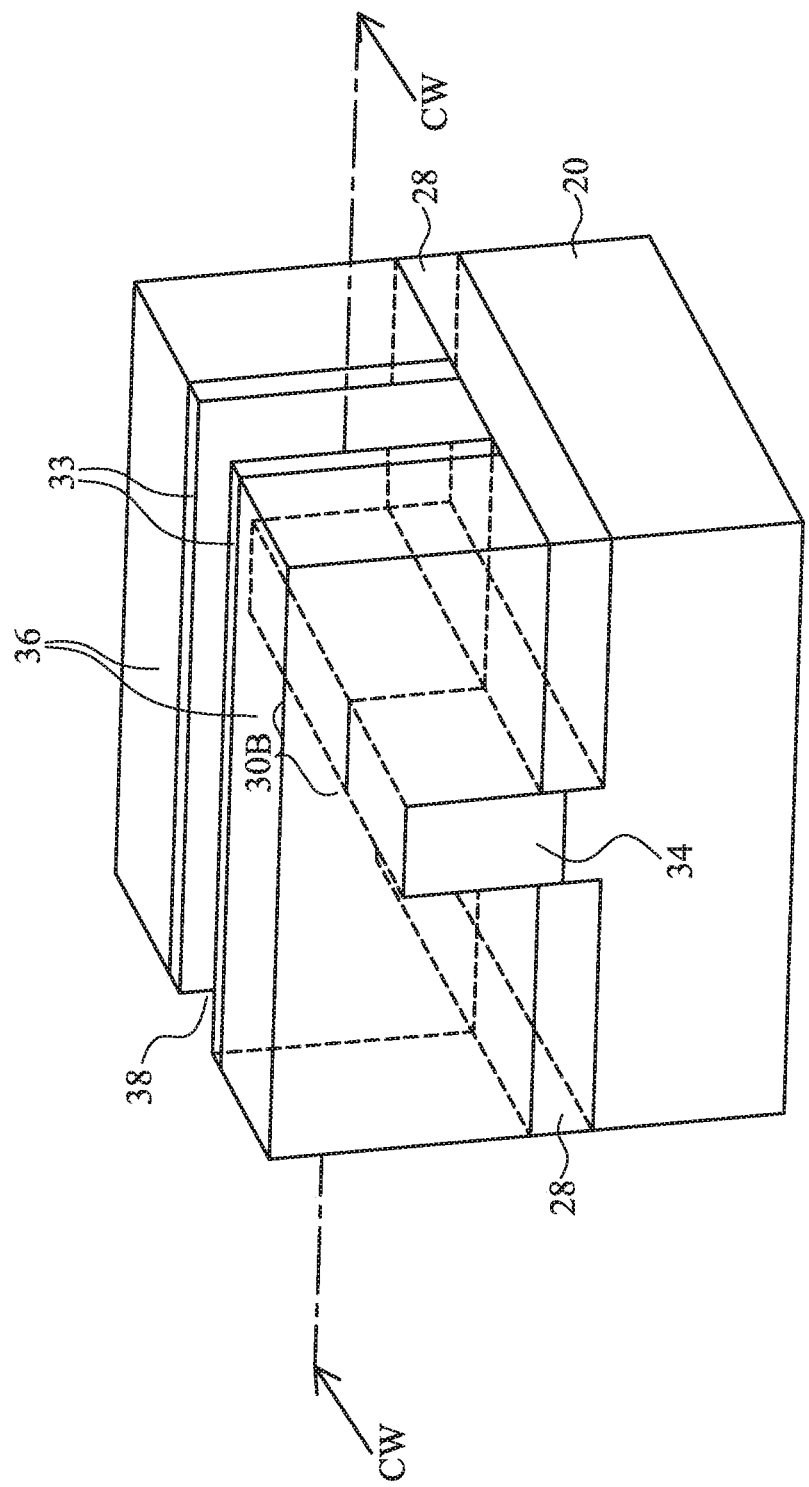

Next, dummy gate 32 is removed in an etching step, so that recess 38 is formed in ILD 36 between spacers 33, as shown in FIG. 1F. The middle portion 30B of semiconductor fin 30 is exposed to recess 38. In the embodiments wherein dummy gate 32 is a composite gate, the bottom layer (such as a silicon nitride layer) of dummy gate 32 may be used as an etch stop layer when the top layer (such as a polysilicon layer) of dummy gate 32 is etched. The bottom layer of dummy gate 32 may be removed after the removal of the top layer of dummy gate 32.

Figure 1G:
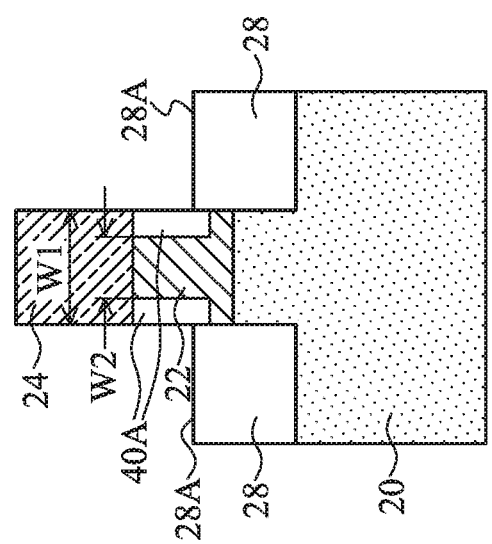

The subsequently illustrated FIGS. 1G through 1J are obtained from the same vertical plane that contains line CW-CW in FIG. 1F. Alternatively stated, the cross-sectional views in FIGS. 1G through 1J are in the channel width direction and cross the channel section of the resulting FinFET. Referring to FIG. 1G, a first oxidation is performed, so that the outer portions of SiGe layer 22 are oxidized, and an inner portion of SiGe layer 22 remains un-oxidized. Silicon layer 24 is also partially oxidized. However, the oxidation rate of silicon layer 24 is much lower (sometimes 30 times lower) than the oxidation of silicon layer 22. The resulting oxide (not shown) on the surface of silicon layer 24 is hence very thin (which may have a thickness smaller than about 5 Å, and is not shown herein. The oxidation may be performed using a furnace oxidation by exposing the respective wafer to oxygen, with an oxidation temperature being between about 500° C. and about 600° C., for example. Alternatively, the oxidation may be performed using a chemical oxidation method at a low temperature (for example, between about 20° C. and 80° C.), using for example, a hydrogen peroxide ($H_2O_2$) solution. Accordingly, silicon germanium oxide ($SiGeO_x$) regions 40A (which are portions of $SiGeO_x$ regions 40 in FIG. 1J) are formed. Value x represents that the percentage of oxygen may change. In some embodiments, the remaining SiGe layer 22 has width W2 smaller than about 70 percent of width W1 (FIG. 1C-1) of SiGe layer 22 before the oxidation. Width W1 may also be the width of silicon layer 24. It is appreciated, however, that the values recited throughout the description are merely examples, and may be changed to different values. Depending on how deep SiGe layer 22 extends below top surface 28A of STI regions 28, there may be some portions of SiGe layer 22 left underlying and overlapped by $SiGeO_x$ regions 40A. Alternatively, there may not be significant portions of SiGe layer 22 left underlying and overlapped by $SiGeO_x$ regions 40A.

Due to the oxidation, the volume of $SiGeO_x$ regions 40A is greater than the volume of the portions of SiGe layer 22 from which the $SiGeO_x$ regions 40A are generated. Accordingly, the swelling of the material results in a lateral strain to be generated to push the source/drain regions 34 (FIG. 1D-2) apart from each other, and a vertical strain to be generated to push up silicon layer 24, wherein silicon layer 24 forms the channel of the resulting FinFET.

After the oxidation, an anneal is performed. The anneal is performed at an elevated temperature in an oxygen-free environment. In some embodiments, the anneal is performed at a temperature between about 450° C. and about 1,100° C. Silicon germanium oxide may have a softening temperature higher than 450° C. The softening temperature of a region is the temperature that when the respective region is annealed at this temperature, the silicon germanium oxide region starts to be softened, and partially liquidized. If the region is annealed at temperatures below the respective softening temperature, the region is not softened. Germanium oxide has a softening temperature higher than about 450° C., silicon oxide has a softening temperature higher than 1,100° C., and silicon germanium oxide has a softening temperature between about 450° C. and about 1,100° C. The silicon germanium oxide with higher germanium percentages have lower softening temperatures than the silicon germanium oxide with lower germanium percentages. Therefore, by selecting anneal temperature to be an appropriate temperature between about 450° C. and about 1,100° C., $SiGeO_x$ regions 40A are softened. It is realized that the softening temperature of silicon germanium oxide is related to the germanium percentage, as shown in Table 1. Table 1 illustrates the brief softening temperature of silicon germanium regions, wherein the optimum anneal temperature may be found referring to Table 1 and the germanium percentage of $SiGeO_x$ region 40A.

TABLE 1

| Germanium Percentage | Softening temperature |
| --- | --- |
| 0 percent to 20 percent | 1,000° C.~1,100° C. |
| 20 percent to 40 percent | 800° C.~1,000° C. |
| 40 percent to 60 percent | 700° C.~800° C. |
| 60 percent to 80 percent | 500° C.~700° C. |
| 80 percent to 100 percent | 450° C.~500° C. |

The anneal temperature is selected to be higher than the softening temperature of the respective $SiGeO_x$ regions 40A. As a result of the anneal, since $SiGeO_x$ regions 40A are softened, the strain generated by $SiGeO_x$ regions 40A is at least partially, and possibly entirely, released. The degree of the strain releasing depends on the difference between anneal temperature and the softening temperature. A higher temperature difference results in a higher degree of softening, and hence more strain is released. Conversely, a lower temperature difference results in a lower degree of softening, and hence less strain is released. When the anneal temperature is as high as about 1,100° C., substantially all strain generated by $SiGeO_x$ regions 40A is released. Conversely, when the anneal temperature is lower than the softening temperature (which is higher than about 450° C., refer to Table 1) of $SiGeO_x$ regions 40A, no strain relief is obtained.

Figure 1H:
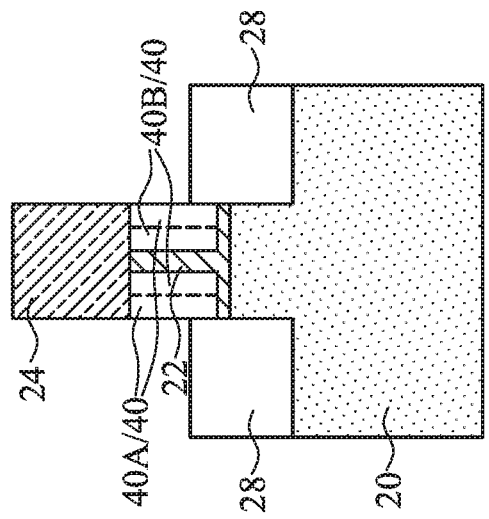

Referring to FIG. 1H, a second oxidation is performed to oxidize more of SiGe layer 22, followed by an additional anneal step after the second oxidation. In the second oxidation, the inner portions of the remaining SiGe layer 22 are oxidized, forming SiGeO$_x$ regions 40B, which are between the opposite portions of SiGeO$_x$ regions 40A. The annealing may be performed using similar process conditions as the annealing step in FIG. 1G. The second anneal results in the strain generated by SiGeO$_x$ regions 40B to be at least partially, or substantially fully, released.

Figure 1J:
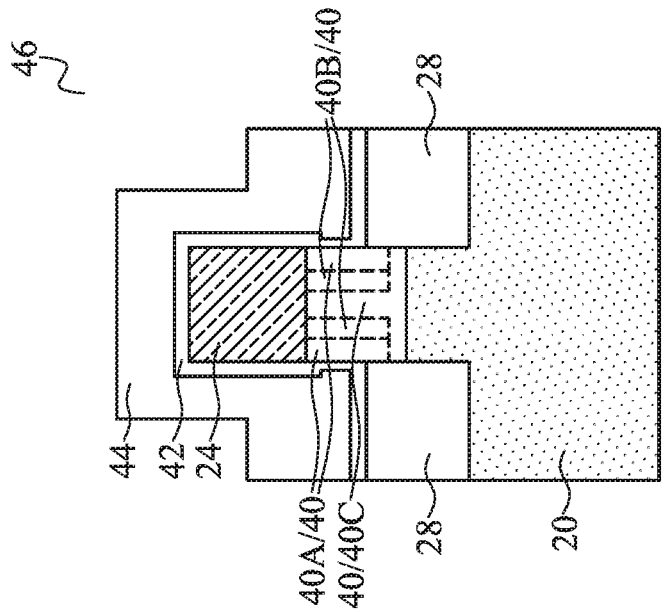
Figure 1I:
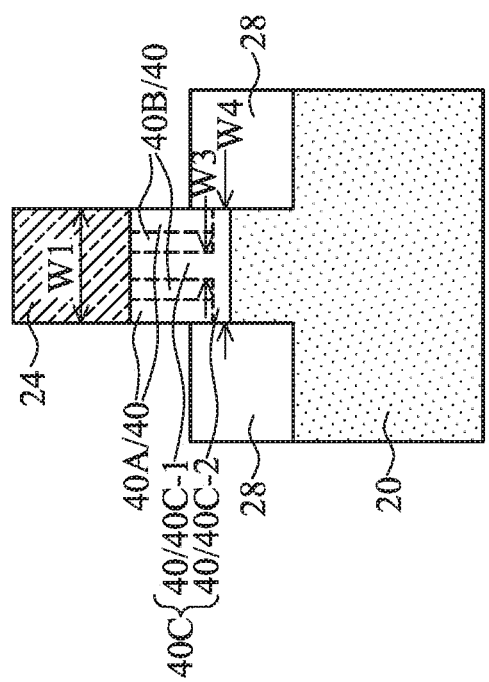

FIG. 1I illustrates the third oxidation to fully oxidize the remaining SiGe layer 22, which results in the generation of SiGeO$_x$ region 40C. SiGeO$_x$ regions 40A, 40B, and 40C in combination form SiGeO$_x$ region 40. SiGeO$_x$ region 40C includes a thin portion 40C-1, which has the top surface contacting the bottom surface of silicon layer 24. Thin portion 40C-1 also has width W3 smaller than width W1 of silicon layer 24, wherein ratio W3/W1 may be between about 0.2 and about 1. In some embodiments, width W3 is equal to width W1, and the vertical stem part of SiGeO$_x$ region 40C disappears since SiGe is totally converted into SiGeOx. In addition, SiGeO$_x$ region 40C includes a wide portion 40C-2 underlying and connected to portion 40C-1. Portion 40C-2 has width W4 close to width W1. In some embodiments, after the formation of SiGeO$_x$ region 40C, no anneal that has the anneal temperature higher than the softening temperature of SiGeO$_x$ region 40C is performed. In alternative embodiments, after the formation of SiGeO$_x$ region 40C, an anneal is performed. The anneal temperature, however, is lower than the softening temperature of SiGeO$_x$ region 40C. For example, the anneal temperature is lower than 1,100° C., and may also be lower than about 600° C., so that the strain of SiGeO$_x$ region 40C is at most partially released, and possibly not release at all.

In alternative embodiments, the step shown in FIG. 1H is not performed, and the step shown in FIG. 1I is performed to oxidize the entire remaining portion of SiGe layer 22. In yet alternative embodiments, the oxidation and the annealing in step 1H is repeated before step 1I is performed. In each repetition, more of remaining SiGe layer 22 is oxidized, and the respective strain is released through an anneal.

FIG. 1J illustrates the formation of gate dielectric 42, and gate electrode 44 on gate dielectric 42. The formation of gate dielectric 42 and gate electrode 44 may include forming a blanket gate dielectric layer using a conformal deposition method, forming a blanket gate electrode using a conformal deposition method, and patterning the gate dielectric layer and the blanket gate electrode layer. Gate dielectric 42 may include a thin silicon oxide layer. Gate dielectric 42 may further include a high-k dielectric layer(s) that is formed of a high-k dielectric material such as hafnium oxide, zirconium oxide, or the like. Other oxides, silicates and/or nitrides of Hf, Al, La, Lu, Zr, Ti, Ta, Ba, Sr, Be, Mg, and/or the like, may also be used in gate dielectric 42. In some embodiments, gate dielectric 42 extends underlying, and contacting, a bottom surface of silicon layer 24, and hence the channel of the respective FinFET extends to the bottom surface of silicon layer 24.

Gate electrode 44 may include Ti, Ta, W, Mo, Ru, Pt, Co, Ni, Pd, Al, polysilicon, or alloys thereof or compound metals such as TiN, TaC, or TaN. FinFET 46 is thus formed, which includes the channel in silicon layer 24, gate dielectric 42, gate electrode 44, and source/drain regions 34 in FIG. 1D-2.

In FIG. 1J, silicon layer 24, which forms the channel of the resulting FinFET 46, is spaced apart from substrate 20 by SiGeO$_x$ region 40. The leakage current between silicon layer 24 and substrate 20 is thus eliminated. In the oxidation of SiGe layer 22, the volume of SiGeO$_x$ regions 40A and 40B are swollen over that of SiGe layer 22. Hence, a tensile strain is generated in the respective channel (silicon layer 24). Due to the annealing for releasing strain, the vertical strain for pushing up silicon layer 24 is reduced, while the lateral stress in the channel length direction remains. Since the vertical strain is undesirable and the lateral strain is desirable, the undesirable strain is reduced without affecting the desirable strain.

FIGS. 2A through 2D illustrate cross-sectional views of intermediate stages in the formation of a FinFET in accordance with alternative embodiments. These embodiments are similar to the embodiments in FIGS. 1A through 1J, except that the strain release includes removing the generated silicon germanium oxide, rather than performing the annealing. Unless specified otherwise, the materials and formation methods of the components in these embodiments are essentially the same as the like components, which are denoted by like reference numerals in the embodiments shown in FIGS. 1A through 1J. The details regarding the formation process and the materials of the components shown in FIGS. 2A through 2D (and FIGS. 3A-3C) may thus be found in the discussion of the embodiment shown in FIGS. 1A through 1J.

The initial steps of these embodiments are essentially the same as shown in FIGS. 1A through 1F. Next, referring to FIG. 2A, an oxidation step is performed to oxidize the outer portion of SiGe layer 22 to form SiGeO$_x$ region 40A. The oxidation may be performed using essentially the same process as in FIG. 1G, and the details are not repeated herein. After the oxidation, an inner portion of SiGe layer 22 remains. In the resulting structure, SiGeO$_x$ regions 40A may apply a vertical strain to silicon layer 24 to push up silicon layer 24 in addition to the lateral strain.

Figure 2A:
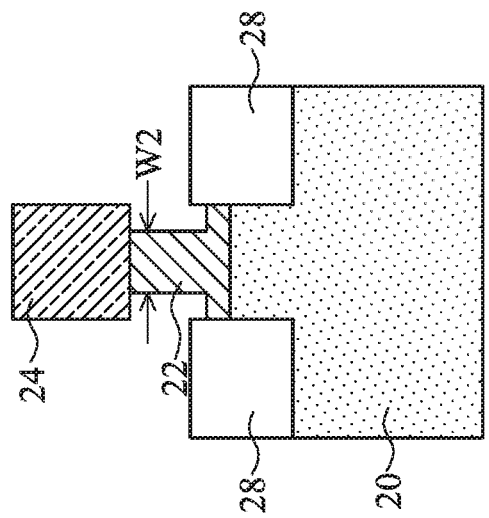
FIGS. 2A through 2D illustrate cross-sectional views of intermediate stages in the manufacturing of a FinFET in accordance with some alternative exemplary embodiments.
Figure 2B:
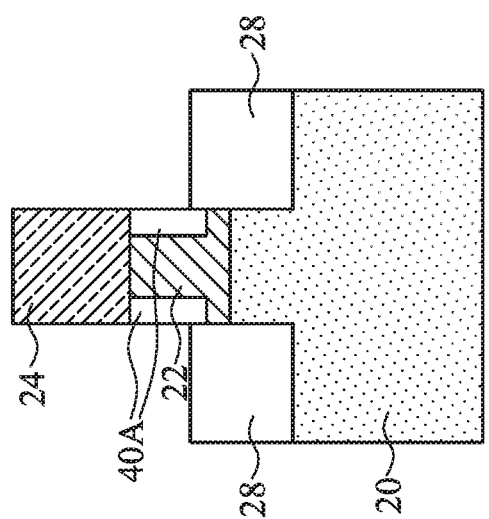
Figure 2C:
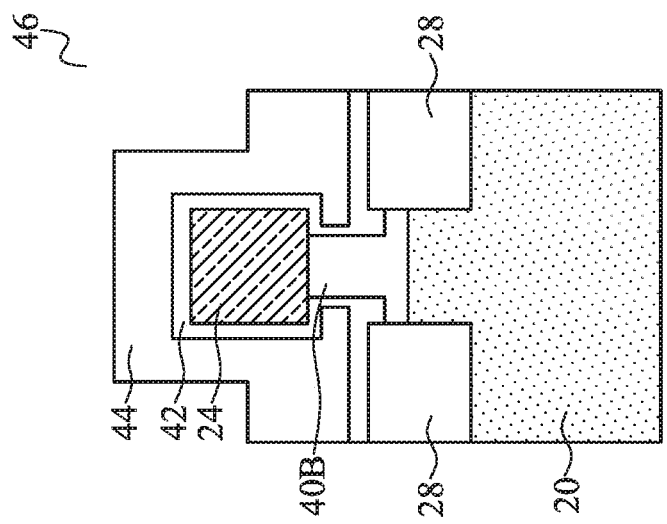

Next, an etching step is performed to remove SiGeO$_x$ regions 40A, and the resulting structure is shown in FIG. 2B. In some embodiments, the etchant may include HF or other etchants that attack silicon germanium oxide. The etching may be isotropic. The etch rate of SiGeO$_x$ regions 40A is much higher than the etch rate of STI regions 28, and hence very small portions of STI regions 28 are etched. After the etch step, the inner portion of SiGe layer 22 is exposed. In some embodiments, the remaining SiGe layer 22 has width W2 smaller than about 70 percent of width W1 (FIG. 1C-1) of the un-oxidized SiGe layer 22. Due to the removal of SiGeO$_x$ regions 40A, the strain caused by SiGeO$_x$ regions 40A is released.

Next, an oxidation is performed, and SiGeO$_x$ region 40B is formed. The oxidation may be performed using the same method as in FIG. 1G. The resulting SiGeO$_x$ region 40B may include thin portion 40B-1, which has the top surface contacting the bottom surface of silicon layer 24. Thin portion 40B-1 also has width W2' smaller than width W1 of silicon layer 24, wherein ratio W2'/W1 may be between about 0.4 and about 1. In addition, SiGeO$_x$ region 40B includes wide portion 40B-2 underlying and connected to portion 40B-1. Portion 40B-2 has width W4 close to width W1.

Figure 2D:
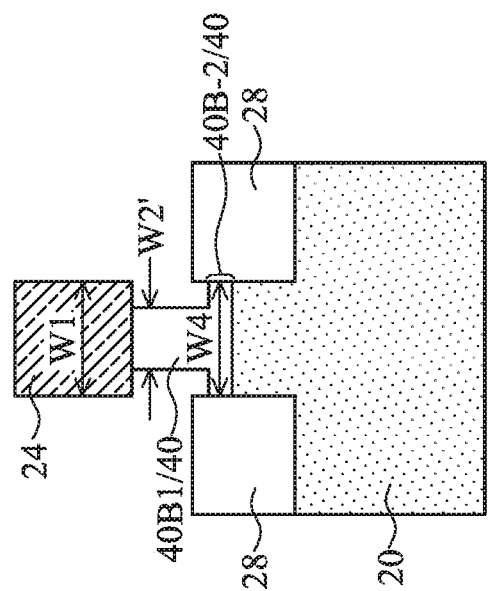

FIG. 2D illustrates the formation of gate dielectric 42 and gate electrode 44 to finish the formation of FinFET 46. In these embodiments, gate dielectric 42 comprises a portion underlying and contacting a bottom surface of silicon layer 24, which forms the channel of FinFET 46. Gate electrode 44 may also include a portion underlying and overlapped by silicon layer 24. The channels of FinFET 46 hence may include the top surface portion, sidewall surface portion, and bottom surface portion of silicon layer 24.

Figure 3C:
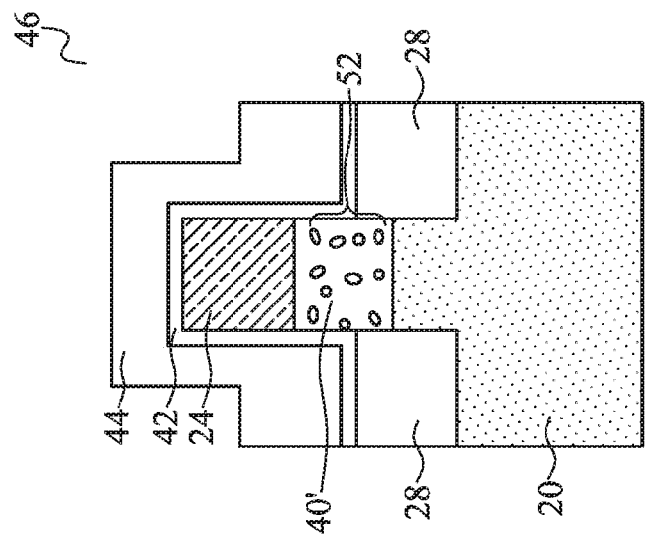
FIGS. 3A through 3C illustrate cross-sectional views of intermediate stages in the manufacturing of a FinFET in accordance with yet alternative exemplary embodiments.
Figure 3B:
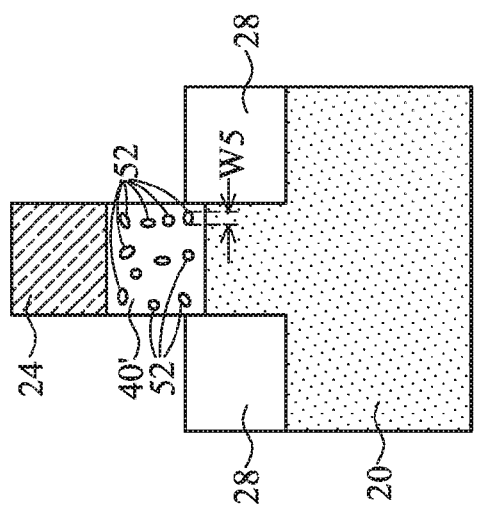
Figure 3A:
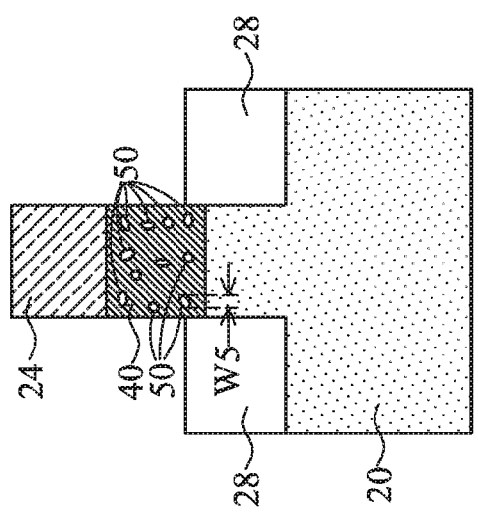

FIGS. 3A through 3C illustrate cross-sectional views of intermediate stages in the formation of a FinFET in accordance with yet other embodiments. The initial structures are the same as in FIGS. 1A through F. Next, as shown in FIG. 3A, SiGe layer 22A is partially oxidized to generate $SiO_2$ region 40. $SiO_2$ region 40 comprises germanium particles 50 therein. Germanium particles 50 are un-oxidized germanium, which may be substantially free from silicon therein. Germanium particles 50 are enclosed by the silicon germanium oxide in $SiO_2$ region 40, and may be separated from each other. In some embodiments, germanium particles 50 have dimensions W5 greater than about 0.5 nm, wherein dimensions W5 may be between about 0.5 nm and about 2 nm.

In some embodiments, the formation of $SiO_2$ region 40 having germanium particles 50 therein is achieved by controlling process conditions. In some exemplary embodiments, the oxidation is performed at a temperature between about 450° C. and about 550° C., for a time period between about 30 minutes and about 120 minutes. It is realized that the optimum conditions are related to the composition (the percentages of germanium and silicon) of SiGe layer 22, and the process conditions such as the temperature, the oxidation time and the like. The process conditions are adjusted in combination so that germanium particles 50 may be generated. It is realized that if the oxidation temperature is too high and/or the oxidation time is too long, all germanium may be oxidized, and there may not be any germanium particles generated. Accordingly, although each of the process conditions may be in a range, without the proper combination of process conditions, the germanium particles 50 may not be generated. In an exemplary embodiment, the germanium percentage of SiGe layer 22 (FIG. 1C-1) is about 40 percent, and the oxidation is performed using a temperature at about 500° C., and for an oxidation time of about 60 minutes.

Next, referring to FIG. 3B, a germanium particle removal step is performed to remove germanium particles 50, wherein the silicon oxide region 40 is left un-removed. The etching is performed using a solution that attacks germanium, but not silicon oxide. In some embodiments, the germanium particle removal is performed by using a hydrogen peroxide ($H_2O_2$)-based solution. For example, the hydrogen peroxide ($H_2O_2$)-based solution may comprise a solution of ($H_2O_2$) and sulfuric acid ($H_2SO_4$).

As a result of the germanium particle removal, pores 52 are formed, as shown in FIG. 3B, and the resulting porous $SiO_2$ region is referred to as region 40'. Pores 52 have width W5 greater than about 0.5 nm, wherein dimensions W5 may be between about 0.5 nm and about 2 nm. Due to the generation of pores 52, the strain, especially the vertical strain pushing up silicon layer 24, which strain is generated by porous $SiO_2$ region 40', may be reduced to a desirable level.

FIG. 3C illustrates the formation of gate dielectric 42 and gate electrode 44 to finish the formation of FinFET 46. The details are similar to what are shown in FIG. 1J, and are not repeated herein.

In the embodiments of the present disclosure, the strain generated by silicon germanium oxidation is reduced. Particularly, the vertical strain may be significantly reduced. The desirable lateral strain in the resulting FinFET may be adjusted to a desirable level, with the undesirable vertical strain reduced, or substantially eliminated.

In accordance with some embodiments, a method includes performing a first epitaxy to grow a silicon germanium layer over a semiconductor substrate, performing a second epitaxy to grow a silicon layer over the silicon germanium layer, and performing a first oxidation to oxidize the silicon germanium layer, wherein first silicon germanium oxide regions are generated. A strain releasing operation is performed to release a strain caused by the first silicon germanium oxide regions. A gate dielectric is formed on a top surface and a sidewall of the silicon layer. A gate electrode is formed over the gate dielectric.

In accordance with other embodiments, a method includes performing a first epitaxy to grow a silicon germanium layer over a semiconductor substrate, performing a second epitaxy to grow a silicon layer over the silicon germanium layer, and performing a first oxidation to oxidize outer portions of the silicon germanium layer to form first silicon germanium oxide regions, wherein an inner portion of the silicon germanium layer remains un-oxidized. The method further includes performing an annealing on the first silicon germanium oxide regions at a temperature higher than a softening temperature of the first silicon germanium oxide regions. After the annealing, a second oxidation is performed to oxidize the inner portion of the silicon germanium layer to form a second silicon germanium oxide region. The method further includes forming a gate dielectric on a top surface and sidewall of the silicon layer. No annealing that has anneal temperatures higher than the softening temperature of the second silicon germanium oxide region is performed between the second oxidation and the step of forming the gate dielectric. A gate electrode is formed over the gate dielectric.

In accordance with yet other embodiments, an integrated circuit device includes a substrate, and a silicon oxide region over the substrate, with pores distributed in the silicon oxide region. A silicon region overlies the silicon oxide region. A gate dielectric is on a top surface and a sidewall of the silicon region. A gate electrode is over the gate dielectric.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate;
   a silicon-containing oxide region over the substrate, with pores distributed in the silicon-containing oxide region;
   a silicon region overlying the silicon-containing oxide region;
   a first epitaxial region contacting a first sidewall of the silicon-containing oxide region and a first sidewall of the silicon region;

a second epitaxial region contacting a second sidewall of the silicon-containing oxide region and a second sidewall of the silicon region, wherein the silicon-containing oxide region is disposed between the first epitaxial region and the second epitaxial region;

a gate dielectric on a top surface and a sidewall of the silicon region; and a gate electrode over the gate dielectric.

2. The device of claim 1 further comprising:

isolation regions extending into the substrate, wherein the silicon-containing oxide region has a portion overlapping a region between opposite portions of the isolation region, and wherein a top surface of the silicon-containing oxide region is higher than a top surface of the isolation regions.

3. The device of claim 2, wherein the silicon-containing oxide region comprises a portion extending into the region between opposite portions of the isolation regions.

4. The device of claim 1, wherein the silicon region and the silicon-containing oxide region are co-terminus.

5. The device of claim 1, wherein the gate dielectric comprises a first vertical portion and a second vertical portion on opposite sides of, and in contact with, the silicon-containing oxide region, wherein the silicon-containing oxide region extends from the first vertical portion to the second vertical portion.

6. The device of claim 5, wherein the silicon-containing oxide region continuously extends from the first vertical portion to the second vertical portion, with no semiconductor region in the silicon-containing oxide region.

7. The device of claim 1, wherein the silicon region is substantially free from germanium.

8. The device of claim 1, wherein a bottom surface of the silicon-containing oxide region is in contact with a top surface of the substrate, with the substrate being a silicon substrate.

9. The device of claim 1, wherein:

the silicon-containing oxide region further has a third sidewall and a fourth sidewall opposite the third sidewall;

the silicon region further has a third sidewall and a fourth sidewall opposite the third sidewall; and the gate dielectric contacts the third sidewall of the silicon-containing oxide region, the fourth sidewall of the silicon-containing oxide region, the third sidewall of the silicon region, and the fourth sidewall of the silicon region.

10. A device comprising:

a semiconductor substrate;

an isolation region comprising a first portion and a second portion;

a first source/drain region contacting the first portion of the isolation region, the first source/drain region having a crystalline structure and being doped with a first dopant;

a second source/drain region contacting the second portion of the isolation region, the second source/drain region having a crystalline structure and being doped with the first dopant;

a silicon oxide region comprising pores therein, the silicon oxide region comprising:

a lower portion between the first source/drain region and the second source/drain region, wherein the lower portion is lower than a top surface of the isolation region; and an upper portion higher than the top surface of the isolation region, wherein the upper portion overlaps the lower portion;

a silicon region overlapping the silicon oxide region;

a gate dielectric comprising a first portion and a second portion on opposite sides of the upper portion of the silicon oxide region; and a gate electrode over the gate dielectric.

11. The device of claim 10, wherein the silicon oxide region forms interfaces with the first portion and the second portion of the gate dielectric, and the interfaces are substantially aligned to respective edges of the silicon region.

12. The device of claim 10, wherein the gate dielectric further comprises a portion overlapping the silicon region.

13. The device of claim 10, wherein the pores comprises first portions higher than the top surface of the isolation region.

14. The device of claim 13, wherein the pores further comprise second portions lower than the top surface of the isolation region.

15. The device of claim 10, wherein the silicon oxide region continuously extends from the first portion to the second portion of the gate dielectric, with no semiconductor region in the silicon oxide region.

16. The device of claim 10, wherein a first bottom surface of the first source/drain region is coterminous with a top surface of the semiconductor substrate, and wherein a second bottom surface of the second source/drain region is coterminous with the top surface of the semiconductor substrate.

17. A device comprising:

a semiconductor substrate;

an isolation region comprising a first portion and a second portion;

a silicon oxide region comprising pores therein;

a silicon region overlapping the silicon oxide region;

a first source/drain region comprising a first sidewall in contact with a first sidewall of the silicon oxide region and a first sidewall of the silicon region;

a second source/drain region comprising a second sidewall in contact with a second sidewall of the silicon oxide region and a second sidewall the silicon region, wherein the silicon oxide region is disposed between the first source/drain region and the second source/drain region;

a gate dielectric comprising portions on opposite sides of the silicon oxide region; and a gate electrode over the gate dielectric.

18. The device of claim 17, wherein the silicon oxide region extends continuously from the first sidewall of the first source/drain region to the second sidewall of the second source/drain region.

19. The device of claim 17, wherein the isolation region contacts an edge of the silicon oxide region.

20. The device of claim 17, wherein the silicon oxide region is under a tensile strain along a longitudinal axis extending from the first source/drain region to the second source/drain region, and wherein the silicon oxide region is substantially free of strain along a vertical axis extending from the semiconductor substrate to the silicon region.

* * * * *